(12) United States Patent
Yuan

(10) Patent No.: US 11,515,498 B2
(45) Date of Patent: Nov. 29, 2022

(54) ARRAY SUBSTRATE, DISPLAY PANEL, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: De Yuan, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 16/638,535

(22) PCT Filed: Jun. 6, 2019

(86) PCT No.: PCT/CN2019/090272
§ 371 (c)(1),
(2) Date: Feb. 12, 2020

(87) PCT Pub. No.: WO2020/164208
PCT Pub. Date: Aug. 20, 2020

(65) Prior Publication Data
US 2021/0217979 A1    Jul. 15, 2021

(30) Foreign Application Priority Data

Feb. 13, 2019    (CN) .......................... 201910112042.7

(51) Int. Cl.
*H01L 51/40*    (2006.01)
*H01L 51/50*    (2006.01)
*H01L 51/52*    (2006.01)

(52) U.S. Cl.
CPC ........ *H01L 51/502* (2013.01); *H01L 51/5218* (2013.01)

(58) Field of Classification Search
CPC ............... H01L 51/502; H01L 51/5218; H01L 51/5024; H01L 51/5016; H01L 27/32
(Continued)

(56) References Cited

U.S. PATENT DOCUMENTS

| 6,946,319 B2 * | 9/2005 | Stegamat ............ H01L 51/5092 438/99 |
| 2005/0088078 A1 * | 4/2005 | Tseng .................... B82Y 20/00 313/504 |

(Continued)

FOREIGN PATENT DOCUMENTS

| CN | 101292372 A | 10/2008 |
| CN | 103872261 A | 6/2014 |

(Continued)

OTHER PUBLICATIONS

International Search Report dated Nov. 13, 2019, issued in counterpart Application No. PCT/CN2019/090272 (12 pages).

(Continued)

*Primary Examiner* — Sheikh Maruf
(74) *Attorney, Agent, or Firm* — WHDA, LLP

(57) ABSTRACT

An array substrate (100) includes a first type of electroluminescent diode (110). The first type of electroluminescent diode (110) includes a first electrode (111), a light emitting structure layer (112) comprising nanoparticles (114), and a second electrode (113) disposed in a stacked manner. The nanoparticles (114) may be configured to increase luminous efficiency of the first type of electroluminescent diode (110).

14 Claims, 12 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2005/0276993 | A1* | 12/2005 | Sohn | H01L 51/0077 428/323 |
| 2006/0076885 | A1* | 4/2006 | Kim | H01L 51/5088 313/506 |
| 2006/0131569 | A1* | 6/2006 | Choi | G11C 13/0016 257/40 |
| 2006/0240279 | A1* | 10/2006 | Adamovich | H01L 51/5016 428/690 |
| 2007/0069199 | A1 | 3/2007 | Choulis et al. | |
| 2007/0077594 | A1* | 4/2007 | Hikmet | B82Y 30/00 435/7.1 |
| 2007/0126347 | A1* | 6/2007 | Jarikov | H01L 51/5076 313/506 |
| 2008/0054783 | A1* | 3/2008 | Xia | H01L 51/5076 313/483 |
| 2011/0031474 | A1* | 2/2011 | Bechtel | B82Y 20/00 257/E51.019 |
| 2011/0062476 | A1* | 3/2011 | Tobise | H01L 51/5275 257/98 |
| 2011/0095266 | A1* | 4/2011 | Hayden | G01T 1/24 257/21 |
| 2011/0187264 | A1 | 8/2011 | Yasuda et al. | |
| 2012/0032138 | A1* | 2/2012 | Kim | H01L 51/5262 257/13 |
| 2012/0299045 | A1* | 11/2012 | Pan | H01L 51/5296 257/98 |
| 2012/0313129 | A1* | 12/2012 | Zettsu | H01L 51/5088 257/E33.061 |
| 2013/0038201 | A1* | 2/2013 | Fukuda | G02B 5/30 313/483 |
| 2013/0200360 | A1* | 8/2013 | Oikawa | H01L 51/0085 257/40 |
| 2015/0115217 | A1* | 4/2015 | Cho | H01L 51/5218 257/13 |
| 2016/0028035 | A1* | 1/2016 | Yang | H01L 51/502 257/40 |
| 2016/0172613 | A1* | 6/2016 | Kim | H01L 51/0008 438/46 |
| 2016/0181537 | A1* | 6/2016 | Pan | H01L 51/0039 528/211 |
| 2016/0190479 | A1* | 6/2016 | Hara | C09K 11/06 257/40 |
| 2016/0190500 | A1* | 6/2016 | Watabe | H01L 51/5265 257/40 |
| 2016/0204356 | A1* | 7/2016 | Yang | H01L 51/0072 257/40 |
| 2016/0240730 | A1* | 8/2016 | Murayama | H01L 33/06 |
| 2016/0254457 | A1* | 9/2016 | Ma | H01L 51/0056 257/40 |
| 2016/0254460 | A1* | 9/2016 | Lin | H01L 51/0061 257/40 |
| 2016/0254461 | A1* | 9/2016 | Inoue | H01L 51/0085 257/40 |
| 2016/0254475 | A1* | 9/2016 | Tsukamoto | H01L 51/5004 257/40 |
| 2016/0380212 | A1* | 12/2016 | Kawakami | H01L 51/0072 257/40 |
| 2016/0380216 | A1* | 12/2016 | Tsai | H01L 51/0085 257/40 |
| 2017/0237042 | A1* | 8/2017 | Biondo | H01L 51/0074 257/40 |
| 2018/0026208 | A1* | 1/2018 | Tsai | H01L 51/0085 257/40 |
| 2018/0054872 | A1* | 2/2018 | Xu | H01L 51/0037 |
| 2018/0097184 | A1* | 4/2018 | Lee | C07D 401/12 |

FOREIGN PATENT DOCUMENTS

| | | |
|---|---|---|
| CN | 106784348 A | 5/2017 |
| CN | 107275497 A | 10/2017 |
| CN | 108878667 A | 11/2018 |
| CN | 109273617 A | 1/2019 |
| CN | 109801951 A | 5/2019 |
| JP | 2015103728 A | 6/2015 |

OTHER PUBLICATIONS

Office Action dated Jun. 17, 2020, issued in counterpart CN Application No. 201910112042.7, with English translation (23 pages).

Xiang, Chaoyu et al., "Origin of Sub-Bandgap Electroluminescence in Organic Light-Emitting Diodes", Small Journal, Oct. 2015, vol. 11, No. 40, pp. 5439-5443. Cited in CN Office Action dated Jun. 17, 2020.

Office Action dated Nov. 22, 2021, issued in counterpart CN application No. 201910112042.7, with English translation. (11 pages).

* cited by examiner

Related Art

ARRAY SUBSTRATE, DISPLAY PANEL, AND DISPLAY APPARATUS

CROSS-REFERENCE TO RELATED APPLICATIONS

This application claims benefit of the filing date of Chinese Patent Application No. 201910112042.7 filed on Feb. 13, 2019, the disclosure of which is hereby incorporated in its entirety by reference.

TECHNICAL FIELD

The disclosure relates to the field of display technology, in particular, to an array substrate, an electroluminescent display panel and a display apparatus.

BACKGROUND

Electroluminescent diodes such as Organic Light Emitting Diode (OLED) and Quantum Dot Light Emitting Diodes (QLED) as an active type of light-emitting device have received strong attention from academia and industry. Compared with a liquid crystal display panel (LCD), the electroluminescent display panel has advantages such as self-luminous, fast response, wide viewing angle, high brightness, being colorful, light and thin, etc., and is widely recognized as a next-generation display technology.

BRIEF SUMMARY

An embodiment of the present disclosure provides an array substrate. The array substrate may include a first type of electroluminescent diode, wherein the first type of electroluminescent diode may include a first electrode, a light emitting structure layer comprising nanoparticles, and a second electrode disposed in a stacked manner. The nanoparticles may be configured to increase luminous efficiency of the first type of electroluminescent diode.

Optionally, the light emitting structure layer comprises: a second electroluminescent layer and the nanoparticles, wherein the nanoparticles are dispersed on a surface of the second electroluminescent layer and/or inside the second electroluminescent layer.

Optionally, the nanoparticles are disposed on the surface of the second electroluminescent layer facing the light-emitting side of the electroluminescent diode.

Optionally, the nanoparticles are disposed on the surface of the second electroluminescent layer in a single layer and spaced apart.

Optionally, the nanoparticles comprise at least one selected from the group consisting of metal nanoparticles, metal oxide nanoparticles, and silicon oxide nanoparticles.

Optionally, the metal nanoparticles comprise at least one of Ag, Au, Ni, Co, or Fe.

Optionally, a material of the second electroluminescent layer is a phosphorescent electroluminescent material.

Optionally, the phosphorescent electroluminescent material is a phosphorescent organic electroluminescent material or a phosphorescent quantum dot electroluminescent material.

Optionally, the first type of electroluminescent diode comprises at least one of a red electroluminescent diode or a green electroluminescent diode.

Optionally, the array substrate further comprises a second type of electroluminescent diode, wherein the second type of electroluminescent diode comprises a first electrode, a first electroluminescent layer, an energy transfer layer and a second electrode disposed in a stacked manner, and the energy transfer layer is configured to reduce a turn-on voltage of the second type of electroluminescent diode.

Optionally, a material of the second electroluminescent layer is a fluorescent electroluminescent material.

Optionally, the fluorescent electroluminescent material is a fluorescent organic electroluminescent material or a fluorescent quantum dot electroluminescent material.

Optionally, a material of the energy transfer layer comprises a fullerene material.

Optionally, the second type of electroluminescent diode comprises a blue electroluminescent diode.

Optionally, the first electrode in the first type of electroluminescent diode and the first electrode in the second type of electroluminescent diode are formed in a same layer with a same material, and the second electrode in the first type of electroluminescent diode and the second electrode in the second type of electroluminescent diode are formed in a same layer with a same material.

Optionally, each of the first electrode in the first type of electroluminescent diode and the first electrode in the second type of electroluminescent diode is a reflective electrode, and each of the second electrode in the first type of electroluminescent diode and the second electrode in the second type of electroluminescent diode is a translucent electrode.

Optionally, each of the first electrode in the first type of electroluminescent diode and the first electrode in the second type of electroluminescent diode is a translucent electrode, and each of the second electrode in the first type of electroluminescent diode and the second electrode in the second type of electroluminescent diode is a reflective electrode.

One embodiment of the present disclosure is a display panel comprising the array substrate according to one embodiment of the present disclosure.

One embodiment of the present disclosure is a display device comprising the display panel according to one embodiment of the present disclosure.

One embodiment of the present disclosure is an array substrate, comprising a second type of electroluminescent diode. The second type of electroluminescent diode comprises a first electrode, a first electroluminescent layer, an energy transfer layer and a second electrode disposed in a stacked manner, and the energy transfer layer is configured to reduce a turn-on voltage of the second type of electroluminescent diode.

Optionally, a material of the energy transfer layer comprises a fullerene material.

BRIEF DESCRIPTION OF THE DRAWINGS

The drawings are used to provide a further understanding of the technical solutions of the present disclosure, and constitute a part of the specification, which together with the embodiments of the present application are used to explain the technical solutions of the present disclosure, and do not constitute a limitation of the technical solutions of the present disclosure. The shapes and sizes of the various components in the drawings do not reflect true proportions, and are merely intended to illustrate the present disclosure.

DETAILED DESCRIPTION

Figure 1:
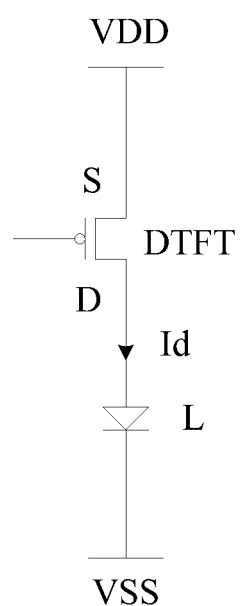
FIG. 1 is an equivalent circuit diagram of a pixel circuit provided by one embodiment of the present disclosure.

The specific embodiments of the array substrate, the electroluminescent display panel, and the display device provided by the embodiments of the present disclosure are described in detail below with reference to the accompanying drawings. It is understandable that the preferred embodiments described herein are intended to illustrate and explain the disclosure and are not intended to limit the disclosure. The embodiments in the present application and the features in the embodiments can be recombined with one another without causing conflicts. It should be noted that the dimensions and shapes of the various figures in the drawings do not reflect the true proportions, and are merely intended to illustrate the present disclosure. The same or similar reference numerals indicate the same or similar elements or elements having the same or similar functions.

In addition, the terms "first" and "second" or the like are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

In one embodiment of the present disclosure, a plurality of pixel units may be disposed on an array substrate. Each of the pixel units may include a plurality of sub-pixels. Each of the sub-pixels may include an electroluminescent diode and a driving pixel circuit that drives the electroluminescent diode to emit light. An electroluminescent diode generally has a turn-on voltage. The electroluminescent diode emits light when a voltage difference between driving voltages applied on two electrodes of the electroluminescent diode is greater than or equal to the turn-on voltage. FIG. 1 shows an equivalent circuit diagram of a pixel circuit driving the electroluminescent diode L to emit light in related art. As shown in FIG. 1, Id represents a driving current for driving the electroluminescent diode L to emit light. DTFT represents a driving transistor for generating the driving current Id. VDD represents a high level voltage provided by the external power supply. VSS represents a low level voltage provided by the external power supply. At the time of light emission, the driving transistor DTFT operates in a saturation region to generate the driving current Id to drive the electroluminescent diode L to emit light. As the emission time of the electroluminescent diode L increases, the internal resistance of the electroluminescent diode L increases, thereby resulting in an increase in the voltage difference between the electrodes of the electroluminescent diode L. This will cause the voltage difference between the source S and the drain D of the driving transistor DTFT to become smaller, thereby causing the driving transistor DTFT possibly to operate in a linear region. As such, the driving current Id is unstable, thereby decreasing lifetime and brightness of the electroluminescent diode L.

For electroluminescent diodes of the same brightness, the higher the luminous efficiency, the smaller the driving current or driving voltage required to drive the electroluminescent diode. The smaller driving voltage is beneficial to improve the stability of the driving current generated by the driving transistor. Moreover, the lifetime LT of the electroluminescent diode and the current density J satisfy the formula: $LT \propto (1/J)^n$, where n is an acceleration factor. Therefore, a smaller driving current is also beneficial for reducing the aging rate of the electroluminescent material in the electroluminescent diode itself, and accordingly increasing LT.

Figure 2:
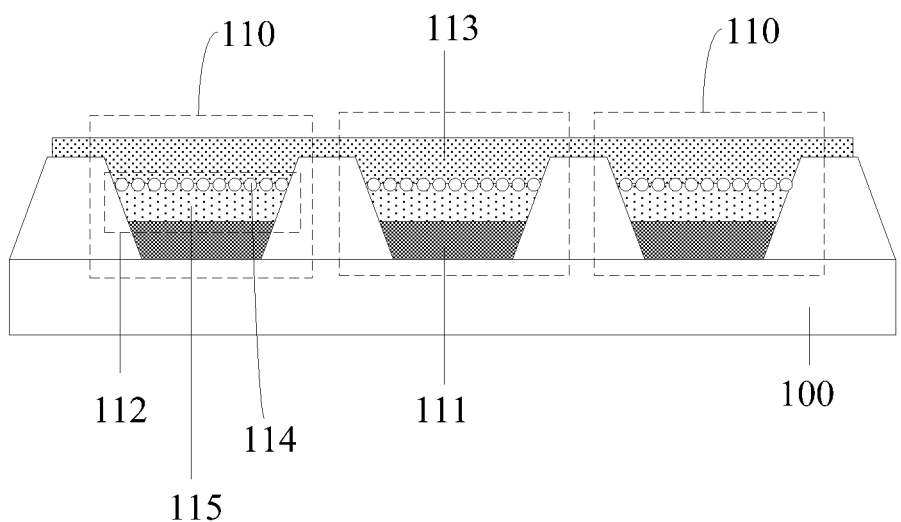
FIG. 2 is a schematic structural diagram of an array substrate provided by one embodiment of the present disclosure.

Based on this, one embodiment of the present disclosure provides an array substrate, as shown in FIG. 2, which may include: a substrate 100 and a plurality of electroluminescent diodes disposed on the substrate 100. The plurality of electroluminescent diodes may include a first type of electroluminescent diode 110. The first type of electroluminescent diode 110 may include a first electrode 111, a light emitting structure layer 112 having nanoparticles 114, and a second electrode 113 disposed in a stacked manner. Among them, the nanoparticles 114 are configured to increase the luminous efficiency of the first type of electroluminescent diodes 110.

The array substrate provided by some embodiments of the present disclosure includes the first type of electroluminescent diode comprising a first electrode, a light emitting structure layer having nanoparticles, and a second electrode disposed in a stacked manner. Since the nanoparticles can improve the luminous efficiency of the first type of electroluminescent diodes, when the same luminance is achieved, the electroluminescent diodes provided with the nanoparticles need a smaller driving current or driving voltage compared to the electroluminescent diodes without the nanoparticles. Thereby, the rate of aging of the electroluminescent material in the first type of electroluminescent diode is reduced and the lifetime thereof is improved.

It should be noted that the introduction of nanoparticles in the first type of electroluminescent diode can promote the radiation process. The promoted radiation process is achieved through the resonance of the electroluminescent material within the electroluminescent diode with plasmon of the surface of the nanoparticles.

Figure 3:
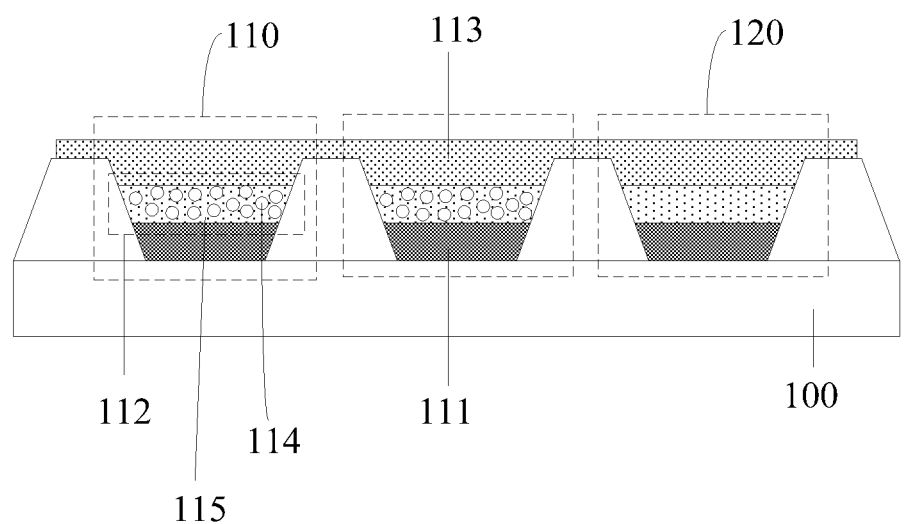
FIG. 3 is a schematic structural diagram of an array substrate provided by one embodiment of the present disclosure.
Figure 4:
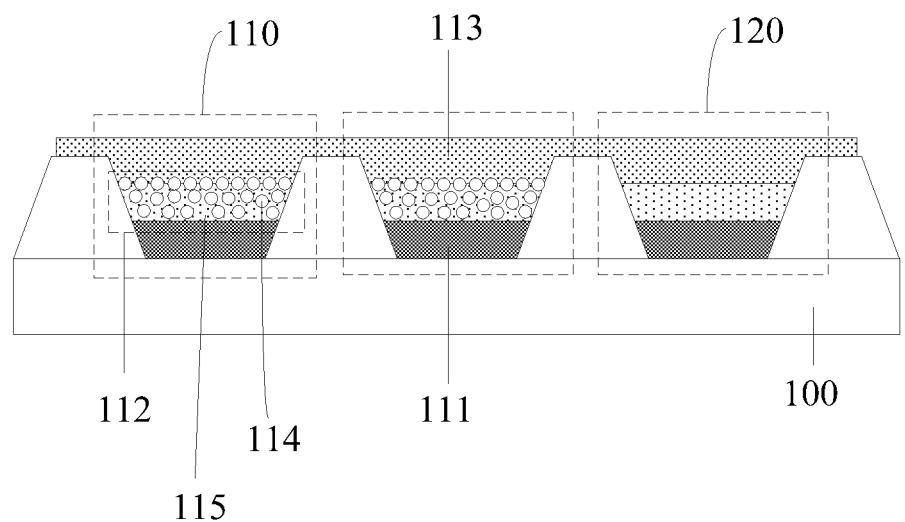
FIG. 4 is a schematic structural diagram of an array substrate provided by one embodiment of the present disclosure.

In one embodiment of the present disclosure, as shown in FIG. 2 to FIG. 4, the light emitting structure layer 112 may include a second electroluminescent layer 115 and nanoparticles 114. As such, the resonance of the electroluminescent material in the second electroluminescent layer 115 with plasmon of the surface of the nanoparticle can be utilized to promote the emission from the second electroluminescent layer 115. In one embodiment, as shown in FIG. 2, the nanoparticles 114 may be dispersed on a surface of the second electroluminescent layer 115. Further, the nanoparticles 114 may be disposed on the surface of the second electroluminescent layer 115 facing the light-emitting side of the electroluminescent diode. As such, the radiation that is promoted by the nanoparticles can be emitted as much as possible, thereby further improving the luminous efficiency. In one embodiment, as shown in FIG. 3, the nanoparticles 114 may be dispersed inside the second electroluminescent layer 115. In this way, the nanoparticles are coated with the molecules of the electroluminescent material, which can effectively suppress the non-radiative energy transfer process. In one embodiment, as shown in FIG. 4, the nanoparticles 114 may be dispersed on the surface of the second electroluminescent layer 115 and inside the second electroluminescent layer 115.

It should be noted that the size of the nanoparticles is in nanoscale, so the shielding effect is weak and even negligible. However, the nanoparticles may also reflect light. In order to increase the intensity of light emission, the nanoparticles 114 may be uniformly dispersed. Further, in order to prevent the nanoparticles from affecting the smoothness of the other film layers, the film layer formed by dispersing the nanoparticles on the surface of the second electroluminescent layer 115 may be as thin as possible. In one embodiment, the nanoparticles are laid in a single layer on the surface of the second electroluminescent layer. Further, the nanoparticles 114 dispersed on the surface of the second electroluminescent layer 115 may be spaced apart by a preset distance to further increase the light output intensity. Since the electroluminescent display panel of different application environments has different requirements on the light intensity, the preset distance can be determined according to the actual application environment, which is not limited herein.

A typical electroluminescent diode may be a bottom emission type or a top emission type. In one embodiment, the electroluminescent diode provided by the embodiment of the present disclosure may be a top emission type electroluminescent diode. As shown in FIG. 2, in the first type of electroluminescent diode 110, the first electrode 111 is located between the light emitting structure layer 112 and the base substrate 100. The second electrode 113 is located on the side of the light emitting structure layer 112 opposite from the base substrate 100. The first electrode 111 may be provided as a reflective electrode such as an anode, and the second electrode 113 may be provided as a translucent electrode such as a cathode to form a top emission type electroluminescent diode. Thus, the light exiting side of the electroluminescent diode may be the side on which the base substrate 100 is provided with an electroluminescent diode. Further, in one embodiment, the second electrode may be made as a translucent electrode from at least one selected from the group consisting of Mg and Mg alloys, Al and Al alloys, and Ag and Ag alloys. The first electrode may be made as an emitter electrode from ITO and a metal, wherein the metal may be at least one selected from the group consisting of Mg and Mg alloys, Al and Al alloys, and Ag and Ag alloys.

Alternatively, the electroluminescent diode provided by one embodiment of the present disclosure may be a bottom emission type electroluminescent diode. Thus, the first electrode 111 can be provided as a translucent electrode, such as an anode, and the second electrode can be provided as a reflective electrode, such as a cathode, to form a bottom emission type electroluminescent diode. Thus, the light exiting side of the electroluminescent diode may be the side of the substrate 10 opposite from the electroluminescent diode.

In one embodiment of the present disclosure, the material of the second electroluminescent layer may be a phosphorescent electroluminescent material. Since the radiation emission of the phosphorescent electroluminescent material comes from the mixing of the singlet state and the triplet state, the time range of the radiation emission is long. The nanoparticles can effectively promote the radiation emission. As such, to achieve the same luminous efficiency, the driving current and driving voltage of the driving electroluminescent diode can be reduced so its lifetime is increased. Further, the phosphorescent electroluminescent material may be a phosphorescent organic electroluminescent material, so that the electroluminescent diode may be a phosphorescent OLED. The phosphorescent electroluminescent material may also be a phosphorescent quantum dot electroluminescent material so that the electroluminescent diode may be a phosphorescent QLED.

In one embodiment of the present disclosure, the nanoparticles may include at least one of metal nanoparticles, metal oxide nanoparticles, or silicon oxide nanoparticles. In order to avoid short circuit of the first electrode and the second electrode through electrical connection of the metal nanoparticles, a gap may be disposed between any two adjacent metal nanoparticles. The specific value of the gap may be determined according to the actual application environment, and is not limited here. Further, the metal nanoparticles may include at least one of Ag, Au, Ni, Co, Fe, etc.

Figure 5:
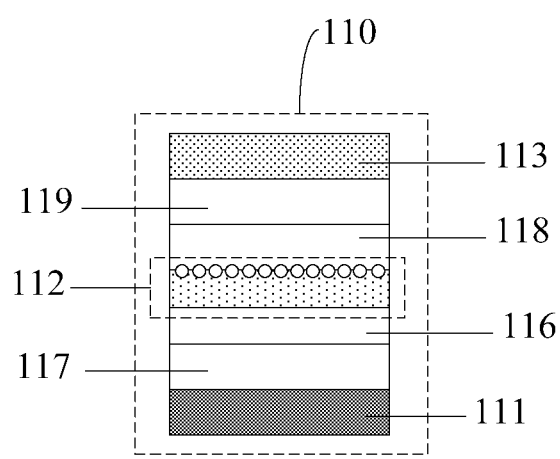
FIG. 5 is a schematic structural diagram of a first type of electroluminescent diode according to one embodiment of the present disclosure.

In one embodiment of the present disclosure, as shown in FIG. 5, the first type of electroluminescent diode 110 may further include: a hole transport layer 116 disposed between the light emitting structure layer 112 and the first electrode 111, a hole injection layer 117 disposed between the hole transport layer 116 and the first electrode 111, an electron transport layer 118 disposed between the light emitting structure layer 112 and the second electrode 113, and an electron injection layer 119 disposed between the electron transport layer 118 and the second electrode 113. Further, the hole transport layer 116 may include an organic material such as a small molecule organic material or a polymer organic material. The electron transport layer 118 may include an organic material or an inorganic material. The materials of the above hole transport layer 116, the hole injection layer 117, the electron transport layer 118, and the electron injection layer 119 can be determined according to the actual application environment, and are not limited herein.

In one embodiment of the present disclosure, as shown in FIG. 2, all of the electroluminescent diodes on the array substrate may be disposed as the first type of electroluminescent diodes 110. Alternatively, as shown in FIG. 3 and FIG. 4, some of the electroluminescent diodes on the array substrate may be disposed as the first type of electroluminescent diodes 110. The structure of remaining electroluminescent diodes 120 may be as the structure of the first type of electroluminescent diodes 110 without nanoparticles disposed, or the structure of the remaining electroluminescent diodes 120 can be substantially the same as that in the prior art, and details thereof are not described herein.

Generally, the display panel adopts lights of three primary colors of red, green and blue, which are mixed to form a white light for display. Thus, at least a red electroluminescent diode, a green electroluminescent diode and a blue electroluminescent diode are generally disposed on the array substrate. Of course, a white light emitting diode can also be provided in order to increase the brightness. Among them, the first type of electroluminescent diodes may include at least one of a red electroluminescent diode and a green electroluminescent diode. This can improve the luminous efficiency of the red electroluminescent diode and the green electroluminescent diode. Alternatively, the first type of electroluminescent diodes may also include a blue electroluminescent diode or a white light emitting diode. In a practical application, the specific implementation of the first type of electroluminescent diode can be determined according to the actual application environment, which is not limited herein.

In one embodiment of the present disclosure, the material of the base substrate may be a rigid material, for example, a glass. Alternatively, the material of the base substrate may be a flexible material, for example, a polyimide (PI), which is not limited herein.

Figure 6A:
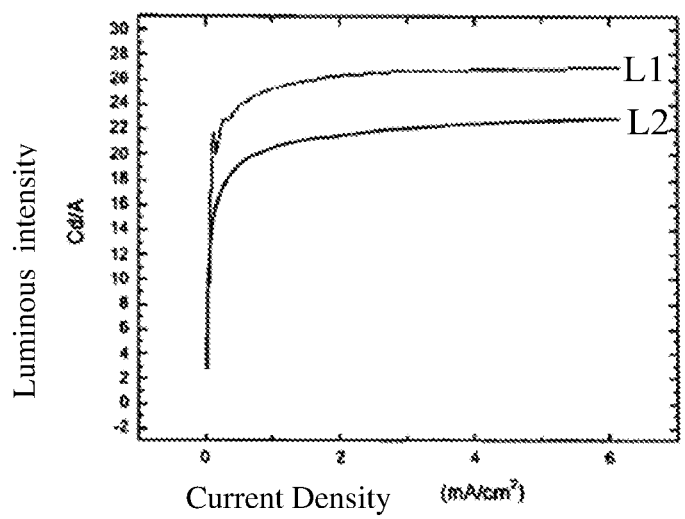
FIG. 6a is a graph showing luminous intensity of a unit current verse current density of an OLED before and after addition of Au nanoparticles according to one embodiment of the present disclosure.

Taking the OLED as the electroluminescent diode and Au nanoparticles as an example, the luminous efficiency-current density curve of the OLED before and after the addition of the Au nanoparticle is measured and shown in FIG. 6a, wherein L1 represents the luminous intensity of unit current verse current density curve corresponding to the OLED with addition of Au nanoparticles, and L2 represents the luminous intensity of unit current verse current density curve corresponding to the OLED without addition of the Au nanoparticles. As can be seen from FIG. 6a, at the same current density, the luminescence intensity of the unit current of the OLED provided with the Au nanoparticle is much higher than that of the OLED without the Au nanoparticles.

Figure 6B:
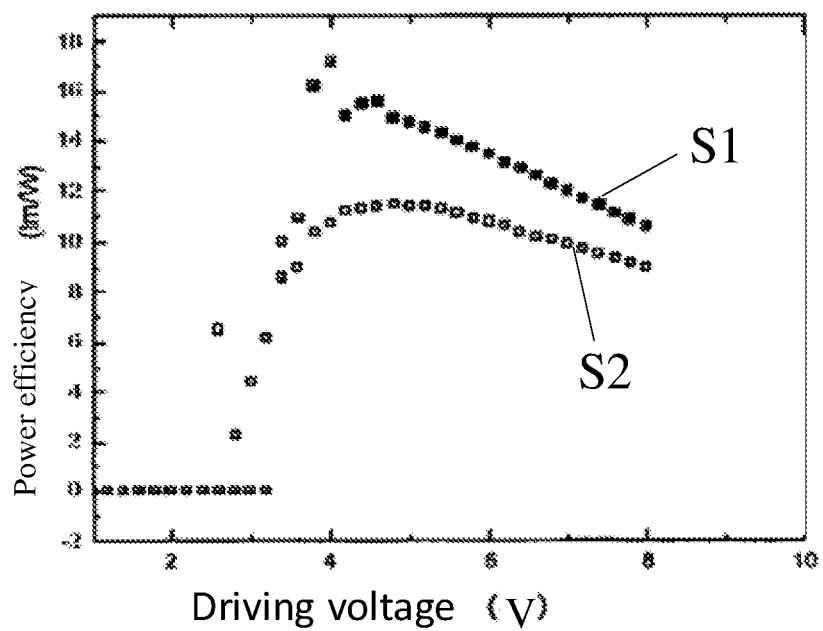
FIG. 6b is a graph showing power efficiency verse driving voltage of an OLED before and after addition of Au nanoparticles according to one embodiment of the present disclosure.

Moreover, a power efficiency verse driving voltage curve of the OLED before and after the addition of the Au nanoparticle is measured and shown in FIG. 6b, wherein S1 represents a power efficiency verse drive voltage curve corresponding to the OLED with addition of the Au nanoparticle, and S2 represents a power efficiency verse drive voltage curve corresponding to an OLED without addition of the Au nanoparticles. As can be seen from FIG. 6b, the OLEDs provided with Au nanoparticles have much higher power efficiency at the same driving voltage than the OLEDs without Au nanoparticles.

According to FIGS. 6a and 6b, the OLED with Au nanoparticles has higher luminous efficiency at the same driving current or driving voltage. For the OLED, when the luminous brightness is the same, the driving current or the driving voltage required for the device with higher luminous efficiency is smaller, so that the lifetime of the OLED can be improved.

Figure 7A:
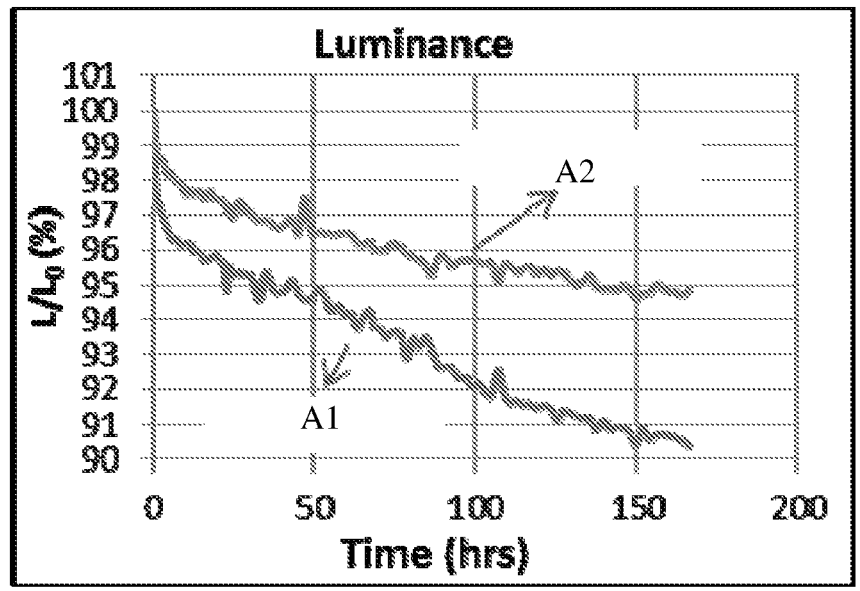
FIG. 7a is a graph showing brightness versus time of an OLED driven respectively by a high driving voltage and a low driving voltage according to one embodiment of the present disclosure.
Figure 7B:
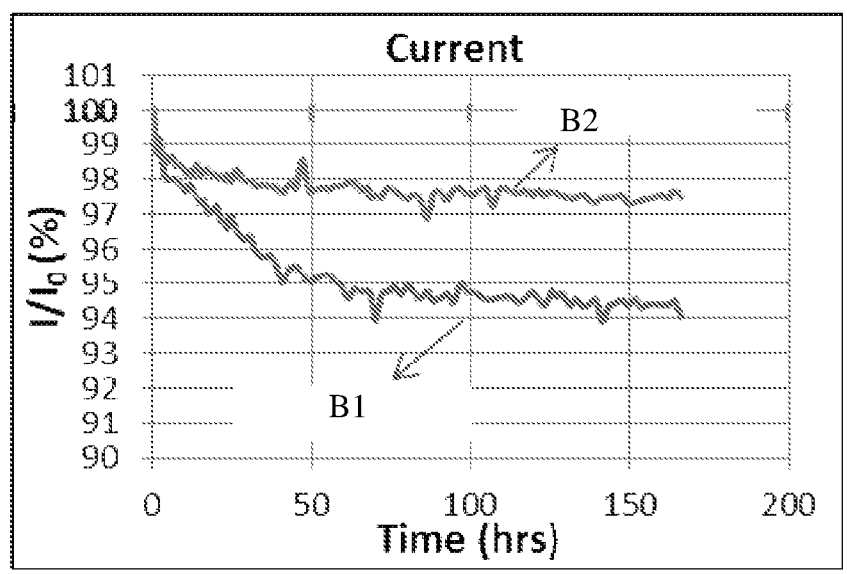
FIG. 7b is a graph showing current versus time of an OLED driven respectively by a high driving voltage and a low driving voltage according to one embodiment of the present disclosure.

Moreover, the luminance of the OLED driven by the high driving voltage and the low driving voltage, respectively, with respect to time is shown in FIG. 7a, wherein A1 represents a luminance versus time curve driven by a high driving voltage, and A2 represents a luminance versus time curve driven by a low driving voltage. A current of the OLED versus time curve driven by a high driving voltage and a low driving voltage respectively is also measured and shown in FIG. 7b, wherein B1 represents a current versus time curve driven by a high driving voltage, and B2 represents a current versus time curve driven by a low driving voltage. As can be seen in FIGS. 7a and 7b, when the driving voltage of the OLED is relatively low, the OLED current becomes more stable and the product life is longer. This is because if the driving voltage required for the OLED is small, the voltage reserved for the driving transistor DTFT is large. Accordingly, the driving transistor DTFT can stably operate in the saturation region, thereby avoiding the problem that the driving current is unstable due to insufficient voltage difference between the source S and the drain D of the drive transistor DTFT. As such, the lifetime of the display device is also increased.

Figure 8:
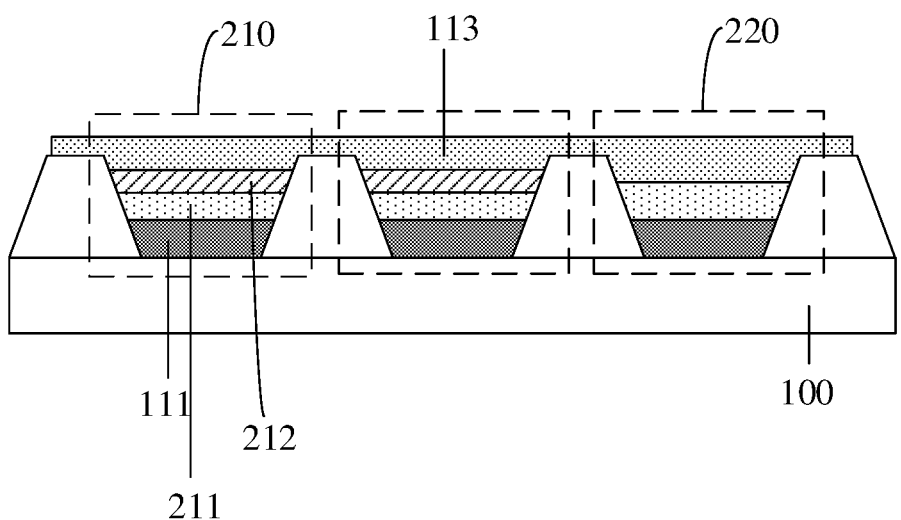
FIG. 8 is a schematic structural diagram of an array substrate provided by one embodiment of the present disclosure.

FIG. 8 shows a schematic structural view of the array substrate according to one embodiment of the present disclosure, which is modified from the previous embodiments. Only the difference between the present embodiment and the previous embodiments will be described below, and the similarities are not described herein.

Generally, when the turn-on voltage of the electroluminescent diode L is relatively low, the required driving voltage is relatively small, and the voltage reserved for the driving transistor DTFT is relatively large. As such, t the driving transistor DTFT can stably operate in the saturation region, thereby avoiding the problem that the driving current is unstable due to insufficient voltage difference between the source S and the drain D of the drive transistor DTFT and accordingly increasing the lifetime of the electroluminescent diode.

In one embodiment of the present disclosure, as shown in FIG. 8, the plurality of electroluminescent diodes may include: at least a second type of electroluminescent diode 210. The second type of electroluminescent diode 210 includes a first electrode 111, a first electroluminescent layer 211, an energy transfer layer 212, and a second electrode 113 disposed in a stacked manner. The energy transfer layer 212 is configured to reduce the turn-on voltage of the second type of the electroluminescent diode 210.

The array substrate provided by the embodiment of the present disclosure includes the second type of electroluminescent diode which includes the first electrode, the first electroluminescent layer, the energy transfer layer and the second electrode. Since the energy transfer layer can lower the turn-on voltage of the second type of electroluminescent diode, the electroluminescent diode provided with the energy transfer layer has a lower turn-on voltage than the remaining electroluminescent diodes without the energy transfer layer. Then, the required driving voltage is smaller, so that the voltage reserved for the driving transistor DTFT is larger. As such, the driving transistor DTFT can stably operate in the saturation region, thereby avoiding the problem that the drive current is unstable due to insufficient voltage difference between the source S and the drain D of the drive transistor DTFT and accordingly increasing the lifetime of the electroluminescent diode.

In one embodiment, the energy transfer layer has a lower LUMO energy level for preventing a large amount of electrons from directly entering the electroluminescent layer. Moreover, the energy transfer layer has high electron mobility for ensuring high luminous efficiency and a low turn-on voltage of the electroluminescent diode.

Figure 9A:
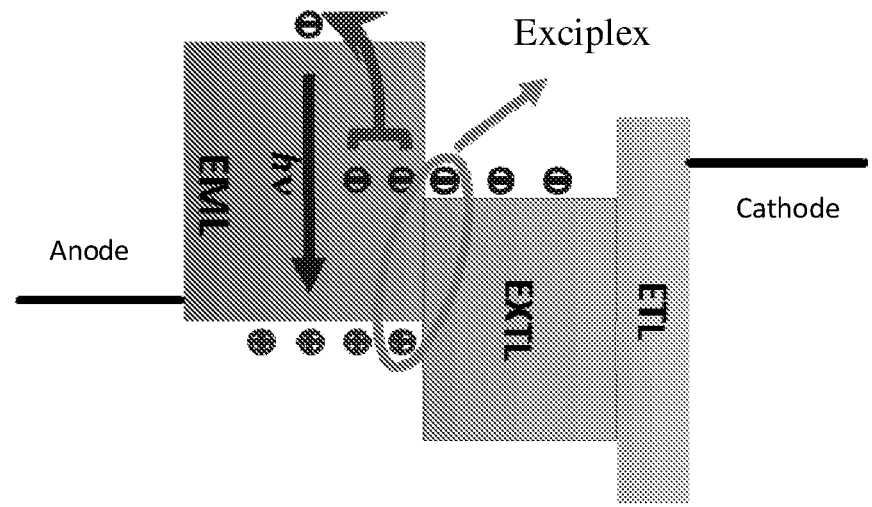
FIG. 9a is a schematic diagram of an energy transfer process in an electroluminescent diode after addition of an energy transfer layer according to one embodiment of the present disclosure.
Figure 9B:
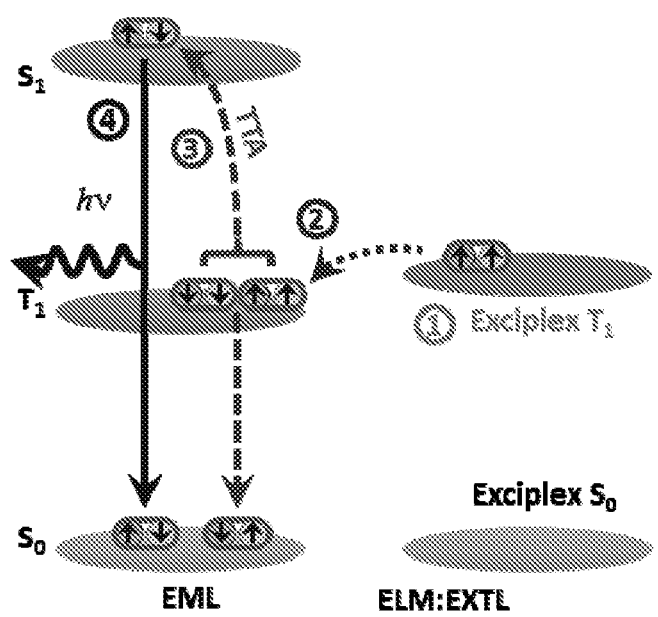
FIG. 9b is another schematic diagram of an energy transfer process in an electroluminescent diode after addition of an energy transfer layer according to one embodiment of the present disclosure.

It should be noted that generally, electrons and holes respectively enter the electroluminescent layer from the second electrode and the first electrode to form excitons to emit light. Referring to FIGS. 9a and 9b, only the second electrode, the first electrode, the electroluminescent layer EML, the energy transfer layer EXTL, and the electron transport layer ETL are shown in FIG. 9a. Among them, the LUMO level of the energy transfer layer EXTL is very low, so that electrons cannot be directly injected into the electroluminescence layer EML in a large amount. Furthermore, the HOMO level of the energy transfer layer EXTL is also very low, so that holes in the electroluminescence layer EML cannot be directly injected into the energy transfer layer EXTL. This causes the holes in the electroluminescent layer EML and the electrons in the energy transfer layer EXTL to form a Exciplex. Thereafter, the energy of the triplet excitons T1 in the Exciplex will be transferred to the triplet excitons T1 in the electroluminescent layer EML via Dexter energy transfer. Thereafter, two triplet excitons T1 in the electroluminescent layer EML are mutually quenched, that is, triplet-triplet annihilation upconversion (TTA). Accordingly, a singlet exciton $S_1$ is generated, as shown in the following formula,

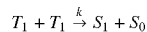

wherein $S_0$ is a ground state, and the reaction rate k depends on the lifetime of $T_1$ and the concentration of $T_1$ in the device. Thereafter, the singlet excitons S1 generated by the mutual quenching described above are de-excited to emit light. Since the triplet excitons of the Exciplex are low in energy, the electroluminescent diode can be made to emit light only if the driving voltage can excite the energy of the triplet excitons of the Exciplex. Accordingly, the electroluminescent diode can have a relatively low turn-on voltage.

Figure 10:
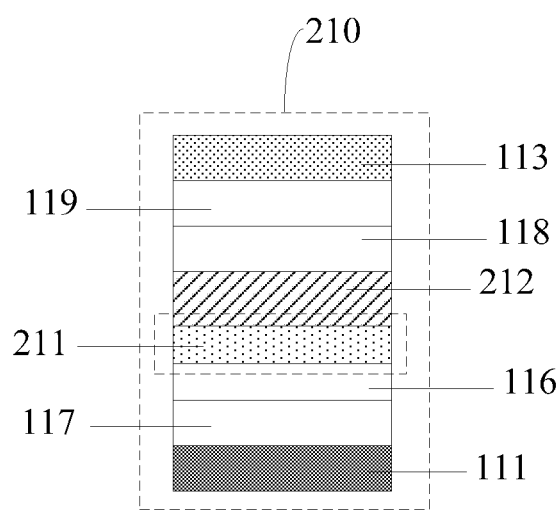
FIG. 10 is a schematic structural diagram of a second type of electroluminescent diode according to one embodiment of the present disclosure.

In one embodiment of the present disclosure, as shown in FIG. 10, the second type of electroluminescent diode 210 may further include: a hole transport layer 116 disposed between the first electroluminescent layer 211 and the first electrode 111, and a hole injection layer 117 disposed between the hole transport layer 116 and the first electrode 111, an electron transport layer 118 disposed between the energy transfer layer 212 and the second electrode 113, and an electron injection layer 119 disposed between the electron transport layer 118 and the second electrode 113.

In one embodiment of the present disclosure, the material of the first electroluminescent layer may be a fluorescent electroluminescent material. Further, the fluorescent electroluminescent material may be a fluorescent organic electroluminescent material, such that the electroluminescent diode may be a fluorescent OLED. Alternatively, the fluorescent electroluminescent material may be a fluorescent quantum dot electroluminescent material, such that the electroluminescent diode may be a fluorescent QLED.

In one embodiment of the present disclosure, the material of the energy transfer layer may comprise a fullerene material, such as C60.

In one embodiment of the present disclosure, all the electroluminescent diodes on the array substrate can be disposed as the second type of electroluminescent diodes 210. Alternatively, as shown in FIG. 8, some of the electroluminescent diodes on the array substrate may be disposed as the second type of electroluminescent diodes 210, and the structure of the remaining electroluminescent diodes 220 may be the same structure of the second type of electroluminescent diodes 210 without the energy transfer layer disposed, or the structure of the remaining electroluminescent diodes 210 can be substantially the same as that in the prior art, and details thereof are not described herein.

In one embodiment of the present disclosure, the second type of electroluminescent diodes may include a blue electroluminescent diode. This can reduce the turn-on voltage of the blue electroluminescent diode. Of course, the second type of electroluminescent diodes may comprise at least one of a red electroluminescent diode and a green electroluminescent diode. In a practical application, the specific implementation of the second type of electroluminescent diodes can be determined according to the actual application environment, which is not limited herein.

Figure 11:
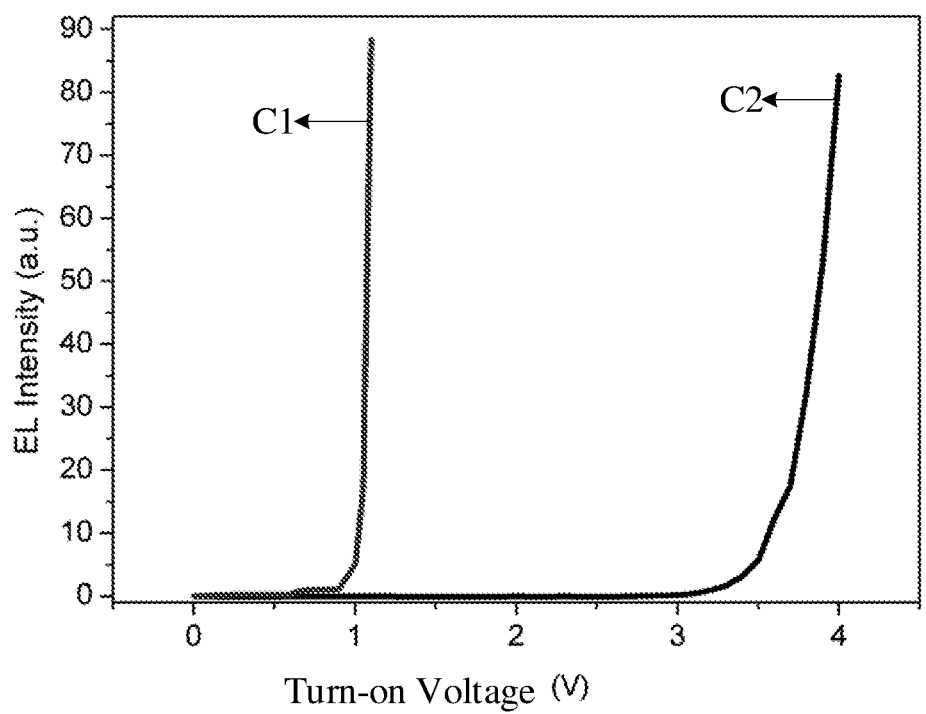
FIG. 11 is a graph showing luminance verse turn on voltage of an OLED before and after addition of an energy transfer layer according to one embodiment of the present disclosure.

The following is an example in which the OLED is used as the electroluminescent diode and the material of the energy transfer layer is C60. The luminance versus turn-on voltage curve of the OLED before and after the addition of the energy transfer layer is measured and shown in FIG. 11. C1 represents the luminance versus turn-on voltage curve corresponding to the OLED with the added energy transfer layer, and C2 represents the luminance versus turn-on voltage curve corresponding to the OLED without the energy transfer layer. As can be seen from FIG. 11, after the addition of the energy transfer layer, the turn-on voltage was reduced from 3.5 V to 1.1V. In this way, the driving voltage required for the OLED is relatively small, and the voltage reserved for the driving transistor DTFT is relatively large. As such, the driving transistor DTFT can stably operate in the saturation region, thereby avoiding the problem that the drive current is unstable due to insufficient voltage difference between the source S and the drain D of the drive transistor DTFT, and accordingly increasing the lifetime.

Figure 12:
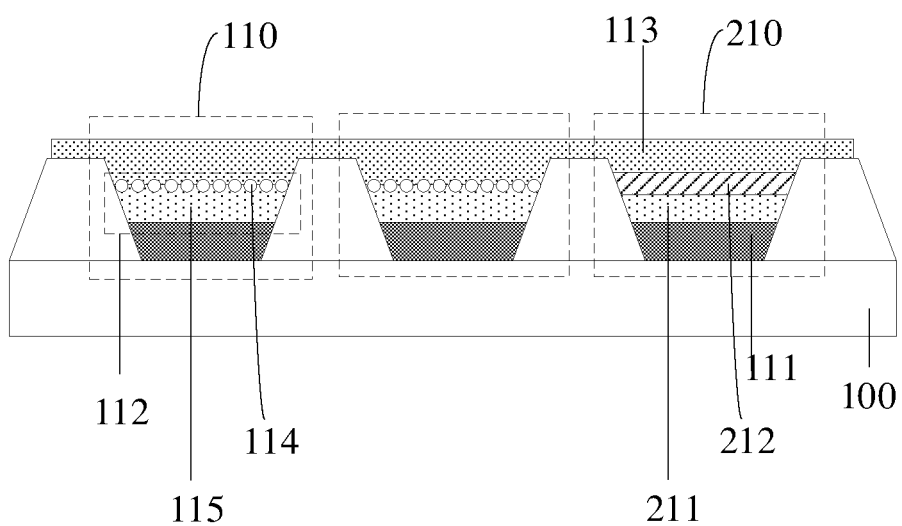
FIG. 12 is a schematic structural diagram of an array substrate according to one embodiment of the present disclosure.

FIG. 12 shows a schematic structural view of an array substrate according to one embodiment of the present disclosure, which is modified from the previous embodiments. Only the differences between this embodiment and the previous embodiments will be described below, and the similarities are not described herein.

In one embodiment of the present disclosure, as shown in FIG. 12, the plurality of electroluminescent diodes include: a first type of electroluminescent diode 110 and a second type of electroluminescent diode 210. The first type of electroluminescent diode 110 includes a first electrode 112, a light emitting structure layer 115 with nanoparticles 114, and a second electrode 113 disposed in a stacked manner. The nanoparticles 114 are configured to enhance the luminous efficiency of the first type of electroluminescent diode 110. Moreover, the second type of electroluminescent diode 210 includes a first electrode 111, a first electroluminescent layer 211, an energy transfer layer 212 and a second electrode 113 disposed in a stacked manner; wherein the energy transfer layer 212 is configured to reduce the turn-on voltage of the second type of the electroluminescent diode 210.

In one embodiment of the present disclosure, as shown in FIG. 12, some of the electroluminescent diodes on the substrate may be set as the first type of electroluminescent diodes 110, and the remaining electroluminescent diodes may be set as the second type of electroluminescence diodes 210. Alternatively, some of the electroluminescent diodes may be set as the first type of electroluminescent diodes 110, some of the electroluminescent diodes may be set as the second type of electroluminescent diodes 210, and the remaining electroluminescent diodes are set as the first type of electroluminescent diode 110 without nanoparticles or the second type of electroluminescent diode 210 without an energy transfer layer. Further, in some embodiments, the first electrodes 111 of the first type of electroluminescent diodes 110 and the second type of electroluminescent diodes 210 thereof may be formed in the same layer with the same material, the second electrodes 113 of the first type of electroluminescent diodes 110 and the second type of electroluminescent diodes 210 thereof may be formed in the same layer with the same material, the hole transport layers 116 of the first type of electroluminescent diodes 110 and the second type of electroluminescent diodes 210 thereof may be formed in the same layer with the same material, the hole injection layers 117 of the first type of electroluminescent diodes 110 and the second type of electroluminescent diodes 210 thereof may be formed in the same layer with the same material, the electron transport layers 118 of the first type of electroluminescent diodes 110 and the second type of electroluminescent diodes 210 thereof may be formed in the same layer with the same material, and the electron injection layers 119 of the first type of electroluminescent diodes 110 and the second type of electroluminescent diodes 210 thereof may be formed in the same layer with the same material. Herein that two features are formed in the same layer means that the two features are formed in the same processing step.

Further, in one embodiment of the present disclosure, the first type of electroluminescent diode 110 may include at least one of a red electroluminescent diode and a green electroluminescent diode. The second type of electroluminescent diode 210 may include a blue electroluminescent diode. Further, each of the pixel units may include a red electroluminescent diode, a green electroluminescent diode, and a blue electroluminescent diode. Wherein, as shown in FIG. 12, all the red electroluminescent diodes and all the green electroluminescent diodes can be the first type of electroluminescent diodes 110, and all the blue electroluminescent diodes can be the second type of electroluminescent diodes 210. Further, the red electroluminescent diode and the green electroluminescent diode may be a phosphorescent OLED or a phosphorescent QLED, and the blue electroluminescent diode may be a fluorescent OLED or a fluorescent QLED. As such, the lifetime of the electroluminescent display panel can be increased.

Based on the same inventive concept, one embodiment of the present disclosure further provides an electroluminescent display panel, including any of the above array substrates. The principle of solving the problem of the electroluminescent display panel is similar to that of the foregoing array substrate. Therefore, the implementation of the electroluminescent display panel can be referred to the implementation of the foregoing array substrate, and the description thereof will not be repeated herein.

Based on the same inventive concept, one embodiment of the present disclosure further provides a display device, including the above electroluminescent display panel provided by the embodiment of the present disclosure. The principle of the display device is similar to that of the foregoing electroluminescent display panel. Therefore, the implementation of the display device can be referred to the implementation of the foregoing electroluminescent display panel, and the description thereof will not be repeated herein.

In a specific implementation, the display device improved by the embodiment of the present disclosure may be any product or component having a display function, such as a mobile phone, a tablet, a television, a monitor, a notebook computer, a digital photo frame, a navigator, etc. Other indispensable components of the display device are understood by those skilled in the art, and are not described herein, nor should they be construed as limiting the disclosure.

In the array substrate, the electroluminescence display panel, and the display device according to some embodiments of the present disclosure, the first type of electroluminescent diodes include a first electrode, a light emitting structure layer with nanoparticles, and a second electrode disposed in a stacked manner. Since the nanoparticles can improve the luminous efficiency of the first type of electroluminescent diodes, when the same luminance is achieved, the electroluminescent diodes provided with the nanoparticles need a smaller driving current or driving voltage compared with the remaining electroluminescent diodes without the nanoparticles. Thereby, the rate of aging of the electroluminescent material in the first type of electroluminescent diode can be reduced and the lifetime thereof can be improved. The second type of electroluminescent diodes includes a first electrode, an electroluminescent layer, an energy transfer layer, and a second electrode disposed in a stacked manner. Since the energy transfer layer can lower the turn-on voltage of the second type of electroluminescent diodes, the electroluminescent diode provided with the energy transfer layer has a lower turn-on voltage than the remaining electroluminescent diodes without the energy transfer layer. Then, the required driving voltage is relatively small, so that the voltage reserved for the driving transistor DTFT is relatively large. Therefore, the driving transistor DTFT can stably operate in the saturation region, thereby avoiding the current attenuation problem caused by the instability of the driving current due to the insufficient voltage difference between the source S and the drain D of the driving transistor DTFT, thereby improving the lifetime.

The principles and the embodiments of the present disclosure are set forth in the specification. The description of the embodiments of the present disclosure is only used to help understand the apparatus and method of the present disclosure and the core idea thereof Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. An array substrate, comprising:
  a first type of electroluminescent diode,
    wherein the first type of electroluminescent diode includes a first electrode, a light emitting structure layer comprising nanoparticles, and a second electrode disposed in a stacked manner, and the nanoparticles are configured to increase luminous efficiency of the first type of electroluminescent diode;
  the light emitting structure layer includes a second electroluminescent layer and the nanoparticles, the nanoparticles are dispersed on a surface of the second electroluminescent layer facing a light-emitting side of the electroluminescent diode;

the array substrate further comprises a second type of electroluminescent diode, wherein the second type of electroluminescent diode comprises a first electrode, a first electroluminescent layer, an energy transfer layer and a second electrode disposed in a stacked manner, and the energy transfer layer is configured to reduce a turn-on voltage of the second type of electroluminescent diode;

the first electrode in the first type of electroluminescent diode and the first electrode in the second type of electroluminescent diode are formed in a same layer with a same material, and the second electrode in the first type of electroluminescent diode and the second electrode in the second type of electroluminescent diode are formed in a same layer with a same material; and the first type of electroluminescent diode does not include the energy transfer layer, the second type of electroluminescent diode does not include the nanoparticles, the second electrode in the first type of electroluminescent diode and the second electrode in the second type of electroluminescent diode are connected, and the first type of electroluminescent diode and the second type of electroluminescent diode emit different colors.

2. The array substrate according to claim 1, wherein the nanoparticles are disposed on the surface of the second electroluminescent layer in a single layer and spaced apart.

3. The array substrate according to claim 1, wherein the nanoparticles comprise at least one selected from the group consisting of metal nanoparticles, metal oxide nanoparticles, and silicon oxide nanoparticles.

4. The array substrate according to claim 3, wherein the metal nanoparticles comprise at least one of Ag, Au, Ni, Co, or Fe.

5. The array substrate according to claim 1, wherein a material of the second electroluminescent layer is a phosphorescent electroluminescent material.

6. The array substrate according to claim 5, wherein the phosphorescent electroluminescent material is a phosphorescent organic electroluminescent material or a phosphorescent quantum dot electroluminescent material.

7. The array substrate according to claim 1, wherein the first type of electroluminescent diode comprises at least one of a red electroluminescent diode or a green electroluminescent diode.

8. The array substrate according to claim 1, wherein a material of the second electroluminescent layer is a fluorescent electroluminescent material.

9. The array substrate according to claim 8, wherein the fluorescent electroluminescent material is a fluorescent organic electroluminescent material or a fluorescent quantum dot electroluminescent material.

10. The array substrate according to claim 1, wherein a material of the energy transfer layer comprises a fullerene material.

11. The array substrate according to claim 1, wherein the second type of electroluminescent diode comprises a blue electroluminescent diode.

12. The array substrate according to claim 1, wherein each of the first electrode in the first type of electroluminescent diode and the first electrode in the second type of electroluminescent diode is a reflective electrode, and each of the second electrode in the first type of electroluminescent diode and the second electrode in the second type of electroluminescent diode is a translucent electrode; or each of the first electrode in the first type of electroluminescent diode and the first electrode in the second type of electroluminescent diode is a translucent electrode, and each of the second electrode in the first type of electroluminescent diode and the second electrode in the second type of electroluminescent diode is a reflective electrode.

13. A display panel comprising the array substrate according to claim 1.

14. A display device comprising the display panel of claim 13.

* * * * *